United States Patent

Miyakuni

[11] Patent Number: 5,942,447
[45] Date of Patent: Aug. 24, 1999

[54] METHOD OF SELECTIVELY ETCHING COMPOUND SEMICONDUCTOR AND METHOD OF MANUFACTURING COMPOUND SEMICONDUCTOR DEVICE USING THE SELECTIVE ETCHING METHOD

[75] Inventor: Shinichi Miyakuni, Tokyo, Japan

[73] Assignee: Mitsubishi Denki Kabushiki Kaisha, Tokyo, Japan

[21] Appl. No.: 08/835,740

[22] Filed: Apr. 10, 1997

[30] Foreign Application Priority Data

Sep. 6, 1996 [JP] Japan .................................. 8-236440

[51] Int. Cl.$^6$ ................................................. H01L 21/302
[52] U.S. Cl. ........................... 438/740; 438/738; 438/718
[58] Field of Search .................................... 438/738, 740, 438/718; 216/77

[56] References Cited

U.S. PATENT DOCUMENTS 5,512,331   4/1996   Miyafuni ................................ 427/528

FOREIGN PATENT DOCUMENTS 3291930   12/1991   Japan .
6224158    8/1994   Japan .

OTHER PUBLICATIONS

"Selective and Nonselective vie of GaAs and AlGaAs In SiCl4 Plasma"; Murad et, al.; Microelectron Eng. (1994'); 23(1–4); abstract.

Miyakuni et al., "Low Ion Energy Electron Cyclotron Resonance Etching Of InP Using $Cl_2/N_2$ Mixture", Journal of Applied Physics, vol. 78, No. 9, 1995, pp. 5734–5738.

Hu et al., "Recent Developments In Reactive Plasma Etching Of III–V Compound Semiconductors", SPIE, vol. 797, 1987, pp. 98–109.

Miyakuni et al., "Low Damage Etching Of InGaAs/AlGaAs By The Electron Cyclotron Resonance Plasma With $Cl_2$/He Mixture For Heterojunction Bipolar Transistors", Journal of Vacuum Science Technology B, vol. 12, No. 2, 1994, pp. 530–535.

Primary Examiner—Benjamin Utech
Assistant Examiner—George Goudreau
Attorney, Agent, or Firm—Leydig, Voit & Mayer

[57] ABSTRACT

A wafer on which a GaAs layer is disposed on an $Al_xGa_{1-x}As$ ($0<x\leq 1$) layer. An etching mask is formed on the GaAs layer. An etching gas containing chlorine, oxygen, and nitrogen is fed into a reaction chamber to generate a plasma having a plasma density of $10^{10} cm^{-3}$ or more, and the GaAs layer is etched using the $Al_xGa_{1-x}As$ layer of the wafer as an etching stop layer. This selective etching method is applied to formation of a gate recess structure in a compound semiconductor device.

18 Claims, 12 Drawing Sheets

METHOD OF SELECTIVELY ETCHING COMPOUND SEMICONDUCTOR AND METHOD OF MANUFACTURING COMPOUND SEMICONDUCTOR DEVICE USING THE SELECTIVE ETCHING METHOD

FIELD OF THE INVENTION

The present invention relates to a method for selectively etching a compound semiconductor and a method of manufacturing a compound semiconductor device using the selective etching method and, more particularly, to a selective etching method preventing a reaction product from being deposited on a surface to be processed when the compound semiconductor is selectively etched and a method of manufacturing a compound semiconductor device using the selective etching method.

DESCRIPTION OF THE RELATED ART

With progress of an information-oriented society, various communication machines must cope with multimedia. For this reason, various machines having high speed and large capacity are being developed. In recent years, a heterojunction device using, e.g., a GaAs/AlGaAs heterojunction structure, has been developed for application in an ultra high frequency range, such as a millimeter wave range, with improvements achieved in the performance of the heterojunction device.

Devices used in a millimeter wave range include HEMTs (high electron mobility transistor) and HFETs (heterojunction field effect transistor), using GaAs substrates. These devices require high gain and low noise, assurance of the stability of the electrical characteristics of an element and an improvement in yield, i.e., stable manufacture of an element having good electrical characteristics.

In the HEMT, a silicon-doped n-type AlGaAs layer is disposed on a GaAs layer or an InGas layer, serving as an active layer, directly or on an intervening undoped AlGaAs layer, and a gate is formed on the n-type AlGaAs layer, directly or on an intervening undoped AlGaAs layer, to control a two-dimensional electron gas generated at a heterojunction interface between the active layer and the AlGaAs layer. The device operates in a millimeter wave range due to the high carrier mobility in the two-dimensional electron gas.

In the HFET, a silicon-doped n-type AlGaAs layer serving as a planar doped layer is directly formed on a silicon-doped n-type GaAs layer serving as an active layer, and a gate is directly formed on the n-type AlGaAs layer.

The millimeter wave frequency range has a short wavelength, i.e., 1 cm or less, and the size of an element cannot be neglected with respect to that wavelength. For this reason, the element requires highly accurate processing and assembly. In an HEMT or HFET, since the AlGaAs layer is strongly related to the operation of the HEMT or HFET, the characteristics of the device are considerably dependent on small variations in the thickness of the AlGaAs layer. Especially, in an HEMT, since small variations in the thickness of the AlGaAs layer considerably influence a two-dimensional electron gas concentration, accurate control of the thickness of the AlGaAs layer in manufacturing the device improves the device characteristics and the yield.

As to the device characteristics which are dependent on the thickness of the AlGaAs layer, the following is known. When the thickness of the AlGaAs layer decreases due to etching, the two-dimensional electron gas concentration decreases, Ids (source-drain current) decreases, or the threshold voltage is lowered.

Therefore, the following considerations are important in the manufacture of a device used in an ultra high frequency band. When a gate recess structure is to be formed in a GaAs layer on an AlGaAs layer, which forms a heterojunction interface with an active layer, selective etching having a selectivity of the AlGaAs layer relative to the GaAs layer prevents the AlGaAs layer from being excessively etched, and a smooth surface is obtained for controlling the thickness of the AlGaAs layer with high accuracy.

In a conventional GaAs/AlGaAs heterojunction structure, when GaAs is selectively dry-etched, RIE (reactive ion etching) or ECR (electron cyclotron resonance) etching using a mixture of a fluorine-based gaseous compound and a chlorine-based gaseous compound has been used.

In each of these methods, non-volatile $AlF_3$ is generated by the reaction between the fluorine in the etching gas mixture and Al in AlGaAs. The selectivity of GaAs/AlGaAs when this etching gas mixture is used is about 100.

However, when this etching gas mixture is used, fluorine contained in the etching gas enters the AlGaAs, and the fluorine reacts with the silicon donor atoms and inactivates the silicon.

As a method of selective etching without using fluorine, as described in Japanese Patent Laid Open No. 3-291930, oxygen is mixed with chlorine, a reactive gas, thereby achieving selectivity in the etching of GaAs/AlGaAs, or chlorine and oxygen are mixed with each other and a microwave excitation electron cyclotron resonance (referred to as ECR hereinafter) plasma apparatus is used for selectively etching GaAs/AlGaAs.

When selectively etching GaAs/AlGaAs using an ECR etching apparatus and oxygen as an etching gas, a mixture of oxygen and chlorine is used. However, since chlorine radicals in the etching gas accelerate etching, when the supply of chlorine is excessive, the balance between the generation and elimination of a reaction product is relaxed, and the reaction product is abruptly deposited on the surface of AlGaAs being etched. As a result, the surface to be processed is degraded, a smooth surface cannot be obtained, and the etching rate of GaAs becomes unstable. For this reason, the surface of AlGaAs becomes rough, the thickness of the AlGaAs layer cannot be controlled accurately, and the supply of chlorine must be suppressed. To suppress the amount of chlorine, pressure and flow rate of the etching gas may be decreased. However, when only gas pressure and gas flow rate are controlled, the quantity of chlorine radicals cannot always be sufficiently reduced, and it is hard to control the quantity of chlorine radicals. Thus, the etching conditions cannot be easily correctly set during etching.

SUMMARY OF THE INVENTION

The present invention has been made to solve the above problems. The object of the present invention is to provide a selective etching method in which a smooth surface to be processed is obtained on a first III–V group compound semiconductor layer containing Al, on the second III–V group compound semiconductor layer from which Al is substantially absent, with a stable etching rate. Another object of the present invention is to provide a method of manufacturing a compound semiconductor device, which is applied to formation of a gate recess structure, preventing silicon donors from becoming inactive, and which produces devices having good electrical characteristics.

As other publications, the following are known.

Japanese Patent Laid-Open No. 7-66175 describes that, in order to etch an In-based compound semiconductor with good morphology and slight damage, a halogen gas and nitrogen are mixed with each other, a plasma etching apparatus is used, and the etching is performed at a plasma density of $10^{10}$ cm.$^{-3}$.

Japanese Patent Laid-Open No. 6-224158 discloses that when an RF bias application type magnetic microwave plasma etching apparatus is used in selectively etching a GaAs/AlGaAs multi-layer in gate-recess processing for an HEMT with a $Cl_2/N_2$ mixture, AlN is generated on the surface of AlGaAs.

SPIE Volume 797, *Advanced Processing of Semiconductor Devices*, (1987) pages 98–109, Evelyn L. Hu et al., reports a method in which a $Cl_2/O_2$ gas mixture is used in RIE and reacts with Al to generate aluminum oxide, thereby producing etching selectivity. The selectivity of GaAs/$Al_{0.30}Ga_{0.07}$ is 10, and the etching rate obtained when a fluorine-based etching gas is used is about 15 to 20 Å/min. However, when a $Cl_2/O_2$ gas mixture is used, the etching rate is 50 Å/min or more, higher than that obtained when the fluorine-based etching gas is used.

According to the present invention, a method of selectively etching a compound semiconductor comprises, on a wafer having a first III–V group compound semiconductor layer containing Al and a second III–V group compound semiconductor layer on the first III–V group compound semiconductor layer and from which Al is substantially absent, forming an etching mask on the second III–V group compound semiconductor layer; supporting the wafer having the etching mask on a support base in a reaction chamber which has an etching gas feed port, a reaction gas exhaust port, and plasma generation means for generating a plasma in the etching gas; and feeding an etching gas mixture containing oxygen, nitrogen, and a halogen, but not fluorine, through the feed port to generate a plasma having a plasma density of not less than $10^{10}$ cm$^{-3}$, and etching the second III–V group compound semiconductor layer of the wafer having the etching mask thereon with the etching gas mixture using the first III–V group compound semiconductor layer of the wafer as an etching stop layer.

The first III–V group compound semiconductor may preferably consist of $Al_xGa_{1-x}As$ ($0<x\leq1$), and the second III–V group compound semiconductor may preferably consist of GaAs.

The concentration of a nitrogen gas contained in the etching gas is preferably 5% or more.

The gas pressure of the etching gas is preferably 1 mTorr or less.

According to the present invention, there is provided a method of manufacturing a compound semiconductor device comprising, on a wafer having a first III–V group compound semiconductor layer containing Al and a second III–V group compound semiconductor layer on the first III–V group compound semiconductor layer and from which Al is substantially absent, forming a mask pattern on the second III–V group compound semiconductor layer, and etching using the mask pattern as a mask to form a recess such that the second III–V group compound semiconductor layer is left on the recess; forming an etching mask on the second III–V group compound semiconductor layer to form an opening in a bottom portion of the recess; supporting the wafer having the etching mask on a support base in a reaction chamber which has an etching gas feed port, a reaction gas exhaust port, and plasma generation means for generating a plasma in the etching gas; feeding an etching gas mixture containing oxygen, nitrogen, and a halogen, but not fluorine, through the feed port to generate a plasma having a plasma density of not less than $10^{10}$ cm$^{-3}$, etching with the etching gas mixture using the first III–V group compound semiconductor layer of the wafer having the etching mask thereon as an etching stop layer, and forming an opening reaching the first III–V group compound semiconductor layer in the second III–V group compound semiconductor layer of the wafer; and depositing a conductive layer, through the opening, on the first III–V group compound semiconductor layer exposed at the bottom of the recess to form a gate.

The first III–V group compound semiconductor may preferably consist of $Al_xGa_{1-x}As$ ($0<x\leq1$), the second III–V group compound semiconductor may preferably be GaAs, and the III–V group compound semiconductor substrate may preferably be GaAs.

A conductive $Al_xGa_{1-x}As$ layer serving as an electron donating layer may be formed on the $Al_xGa_{1-x}As$ layer in the first step, and the conductive $Al_xGa_{1-x}As$ layer may be formed on the GaAs substrate through an undoped InGaAs layer serving as an active layer.

A conductive $Al_xGa_{1-x}As$ layer may be formed on the $Al_xGa_{1-x}As$ layer, and the conductive $Al_xGa_{1-x}As$ layer may be formed on the GaAs substrate through an intervening conductive GaAs layer serving as an active layer having the same conductivity type as the conductive $Al_xGa_{1-x}As$ layer.

The concentration of nitrogen in the etching gas is preferably 5% or more.

The gas pressure of the etching gas is preferably 1 mTorr or less.

DESCRIPTION OF THE PREFERRED EMBODIMENTS

Embodiment 1

Embodiment 1 relates to selective etching of a wafer having a first III–V group compound semiconductor layer containing Al and a second III–V group compound semiconductor layer on the first III–V group compound semiconductor layer and from which Al is substantially absent. In this embodiment $Al_xGa_{1-x}As$ ($0<x\leq1$) is used as the first III–V group compound semiconductor containing Al, and GaAs is used as the second III–V group compound semiconductor from which Al is absent.

Figure 1:
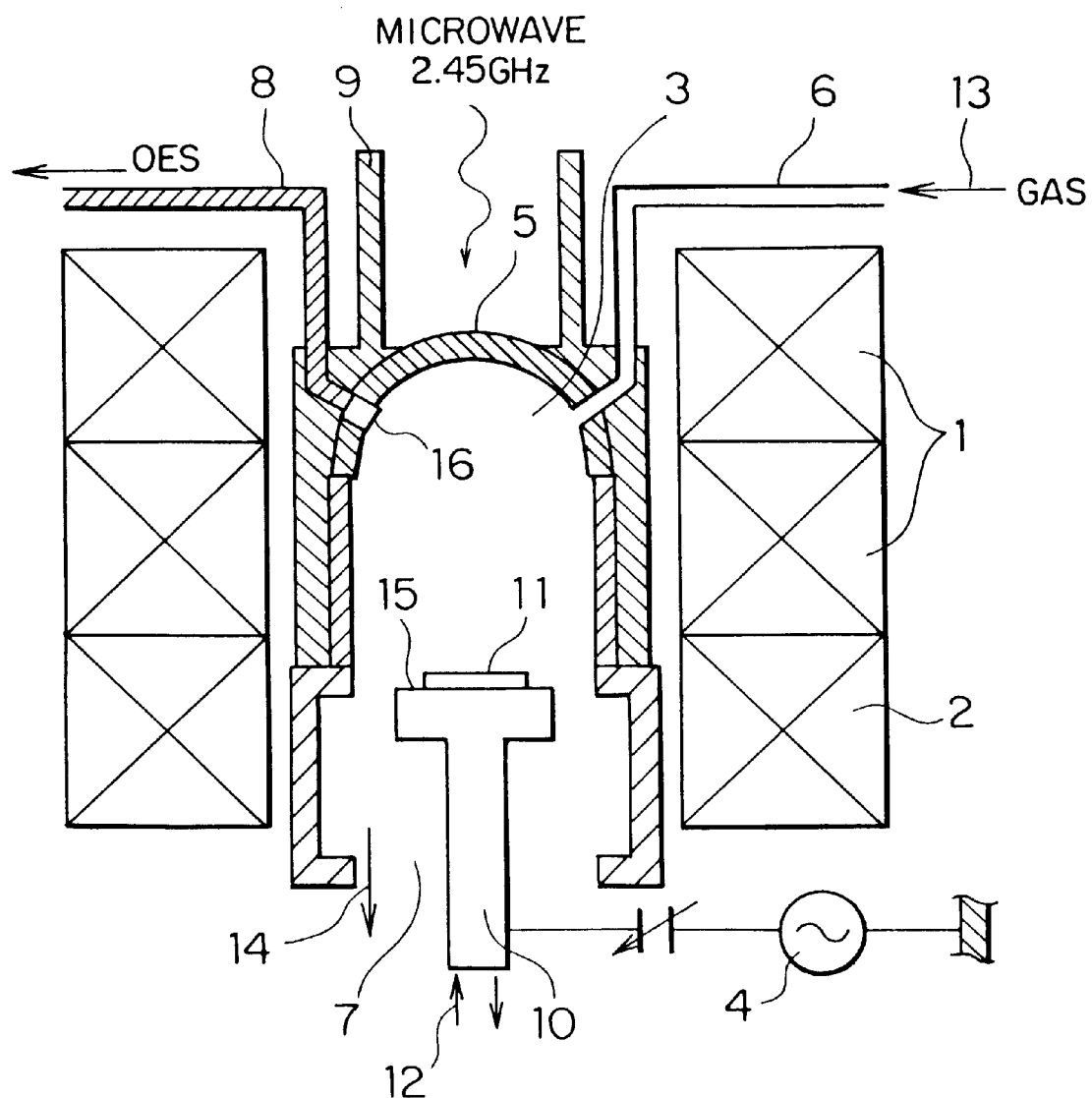
FIG. 1 is a sectional view showing a composite magnetic electron cyclotron etching apparatus according to the present invention.

FIG. 1 is a sectional view showing a composite magnetic electron cyclotron etching apparatus (referred to as ECR etching hereinafter, ECR: electron cyclotron resonance) used in Embodiment 1. Referring to FIG. 1, reference numeral 1 denotes a main magnetic coil; 2, an auxiliary magnetic coil; 3, a plasma generation chamber serving as a reaction chamber; 4, an RF oscillator; 5, a quartz window; 6, a feed port for supplying an etching gas; 7, an exhaust port for removing a reaction product upon completion of reaction; 8, a plasma emission analyzing apparatus (OES (optical emission spectroscopy) is used in this case); 9, a waveguide; 10, a substrate holder serving as a support base; 11, a wafer; 12, a feed/exhaust direction of cooling water; 13, a feed direction of an etching gas; 14, an exhaust direction; 15, a wafer supporting surface of the substrate holder 10; and 16, a detection end of the OES 8.

The main magnetic coil 1 and the auxiliary magnetic coil 2 surround the plasma generation chamber 3, and the waveguide 9 for feeding microwave energy is arranged at the quartz window 5 in the ceiling of the plasma generation chamber 3. A microwave oscillator (not shown) is connected to the plasma generation chamber 3 through the waveguide 9.

At the center of the inside of the plasma generation chamber 3, the substrate holder 10 having the wafer placing surface 15 for the wafer 11 which opposes the quartz window 5 is arranged. The substrate holder 10 can be cooled with cooling water. The RF oscillator 4 is connected to the substrate holder 10 such that an RF bias at 13.56 MHz can be applied to change the energy of ions incident on the wafer 11.

In the plasma generation chamber 3, the etching gas feed port 6 and the exhaust port 7 ara arranged symmetrically with respect to a position near the wafer supporting surface 15 of the substrate holder 10 so that feeding and exhausting of the etching gas mixture at a position near the wafer supporting surface 15 of the substrate holder 10 can be smoothly performed. In Embodiment 1, on the upstream side of the etching gas feed port 6, gas feeding units (not shown) for chlorine, oxygen, nitrogen, and, if necessary, an inert gas, such as helium, serving as a dilution gas, are arranged.

A vacuum unit (not shown) is arranged on the downstream side of the exhaust port 7. When the vacuum unit cooperates with the gas feed unit on the upstream side of the etching gas feed port 6, the reaction gas can be rapidly exhausted to control gas pressure in the plasma generation chamber 3. The inner diameter of the plasma generation chamber 3 used in Embodiment 1 is 260 mm, the diameter of the substrate holder 10 is 210 mm, and the distance between the wafer supporting surface 15 of the substrate holder 10 and the quartz window 5 is 220 mm.

The detection end 16 of the OES 8 for measuring the state of a plasma in the plasma generation chamber 3 is arranged above the wafer supporting surface 15 of the substrate holder 10. In addition, the ECR etching apparatus comprises a load lock chamber (not shown) so that loading and unloading of the wafer 11 can be efficient.

In the ECR etching apparatus in Embodiment 1, a reaction chamber is also used as a plasma generation chamber. However, the following arrangement may be used. A reaction chamber and a plasma generation chamber may be independent, and the plasma generation chamber arranged on the feed side of the etching gas to feed a generated plasma into the reaction chamber.

The wafer 11 is placed on the wafer supporting surface 15 of the substrate holder 10 through a load lock chamber, the plasma generation chamber 3 is sealed air tightly, and an etching gas is fed from the feed port 6. The gas feed unit on the upstream side of the etching gas feed port 6 cooperates with the vacuum unit on the downstream side of the exhaust port 7 to control the gas pressure in the plasma generation chamber 3 at a predetermined pressure.

The main magnetic coil 1 and the auxiliary magnetic coil 2 are energized to generate a composite magnetic field, and power is adjusted. The ECR resonance magnetic field is adjusted to 875 gauss (G), and microwave energy is fed through the quartz window 5 at 2.45 GHz and adjusted in power. In this manner, an ECR resonance region is produced at a position spaced from the wafer by a distance of about 100 $\mu$m to satisfy cyclotron resonance conditions, and the microwave energy is maximally efficiently absorbed by electrons for ionization at a high efficiency, thereby generating an ionization plasma of the etching gas.

The distance between the ECR resonance and the wafer can be adjusted by the intensity of the composite magnetic field. When the intensity of the main magnetic field is increased, the ECR resonance region becomes closer to the wafer 11; when the intensity of the main magnetic field is decreased, the ECR resonance region becomes closer to the quartz window 5.

When an RF bias at 13.56 MHz is applied by the RF oscillator 4, ions are accelerated toward the wafer 11 to make it possible to draw a reactive ion beam to the wafer surface. The RF bias is adjusted to change the energy of the ions incident on the wafer 11.

The temperature of the wafer 11 can be adjusted from room temperature to 250° C. by adjusting the temperature of the substrate holder 10 with a heater in the substrate holder 10. The wafer 11 can be etched while the temperature of the wafer 11 is properly adjusted.

Using the samples of GaAs and $Al_xGa_{1-x}As$ ($0<x\leq1$), an etching test for establishing etching conditions was performed. A semi-insulating GaAs substrate was used as an etching sample, a multi-layered structure of $Al_xGa_{1-x}As$ having a thickness of 5,000 Å was grown on the semi-insulating GaAs substrate, and GaAs having a thickness of 100 Å and serving as a cap layer was grown on the $Al_xGa_{1-x}As$ layer. When the $Al_xGa_{1-x}As$ layer was used as the uppermost layer, the $Al_xGa_{1-x}As$ layer was not easily etched due to oxidation. In order to prevent this effect, the GaAs cap layer was formed.

The etching samples were loaded in the ECR etching apparatus shown in FIG. 1, and the plasma density of the etching gas mixture was set to $10^{10}$ cm$^{-3}$ or more according to the operation of the ECR etching apparatus, thereby producing etching. During etching, the manner of etching was monitored by plasma emission analysis using the OES 8. The range of wavelengths which could be measured by the OES 8 was 250 nm to 1,200 nm. In particular, emissions from Cl radicals were monitored to monitor the concentration of Cl radicals.

Table 1 is a table showing the etching conditions for the etching test.

TABLE 1

| Gas type | Gas mixture of $Cl_2$, He, $O_2$, and $N_2$ |
| --- | --- |
| Gas pressure (mtorr) | 0.4 to 1.0 |
| Total gas flow rate (SCCM) | 20 (constant) |
| $N_2$ concentration (%) | 0 to 90 |
| Al composition (%) | 21 to 30 |
| $Cl_2$ concentration (%) | 10 to 30 |
| Microwave output (W) | 200 |
| RF output (W) | 0 to 30 |
| Main magnetic field coil current (A) | 15 (constant) |
| Auxiliary magnetic field coil current (A) | 23 (constant) |
| Substrate holder temperature | room temperature |

The necessary concentration of $N_2$ in the etching gas mixture is determined by observing the emission intensity of Cl atoms during etching. When the concentration of $N_2$ is about 5%, the emission intensity of Cl atoms considerably decreases. As the concentration of $N_2$ gas increases, the emission intensity gradually decreases but does not considerably decrease. Therefore, the concentration of $N_2$ is satisfactorily set to 5% or more.

Figure 2:
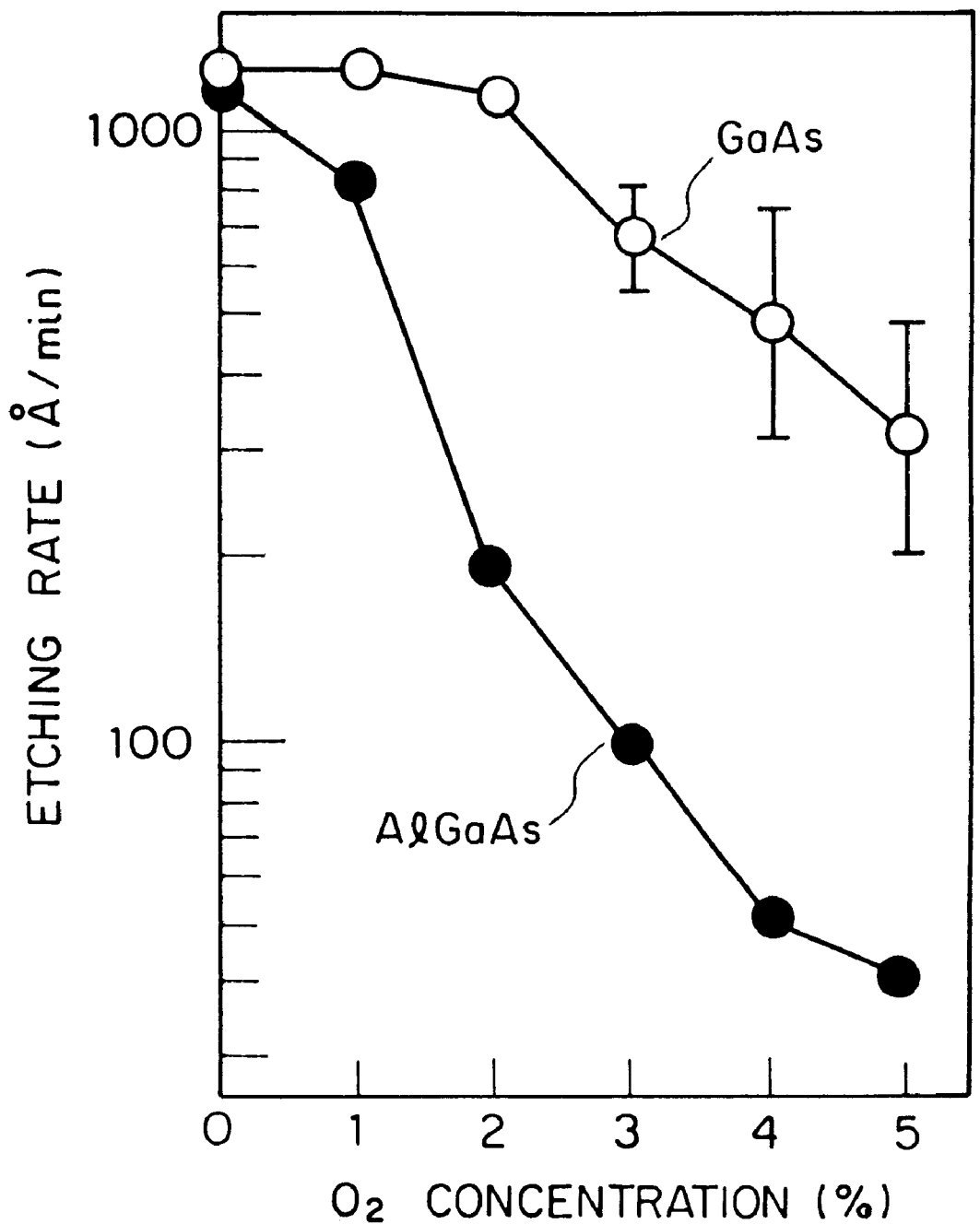
FIG. 2 is a graph showing the etching rates of GaAs and $Al_{0.30}Ga_{0.70}As$ in a gas mixture of $Cl_2$, He, and $O_2$ to be compared with the etching method of the present invention.

FIG. 2 is a graph showing the etching rates of GaAs and $Al_{0.30}Ga_{0.70}As$ in a gas mixture of $Cl_2$, He, and $O_2$ to be compared with the etching rates of the present invention. The etching conditions in FIG. 2 were set as follows: gas pressure was 0.5 mTorr; gas flow rate was 2 SCCM; and He was used as a dilution gas. The RF output was constant at 30 W.

As shown in FIG. 2, GaAs and $Al_{0.30}Ga_{0.70}As$ are etched at equal etching rates without oxygen, and the etching rates of GaAs and $Al_{0.30}Ga_{0.70}As$ decrease with an increase in oxygen concentration. More particularly, the etching rate of $Al_{0.30}Ga_{0.70}As$ abruptly decreases due to the formation of aluminum oxide at an oxygen gas concentration of about 2%. The selectivity between GaAs and $Al_{0.30}Ga_{0.70}As$ can be obtained from the difference between the etching rates of $Al_{0.30}Ga_{0.70}As$ and GaAs. However, when oxygen concentration exceeds 3%, a reaction product is deposited on the etching surface, and the etching rate of GaAs becomes unstable.

Figure 3:
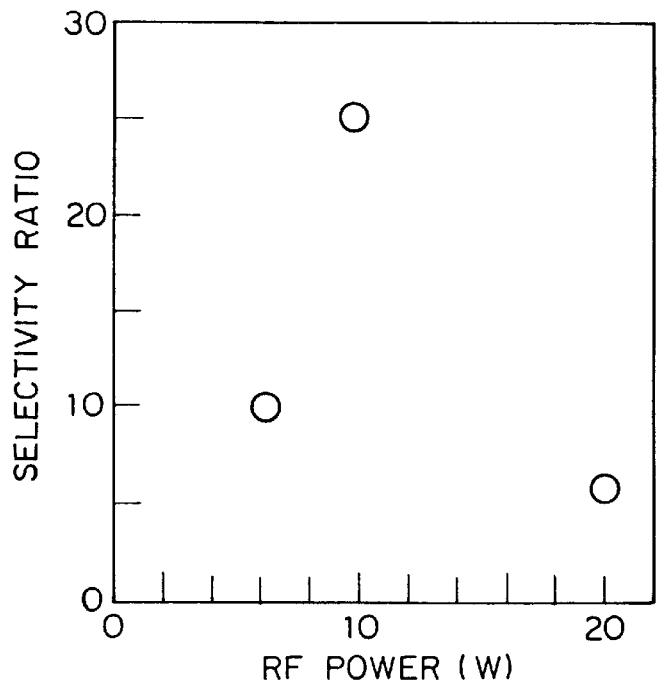
FIG. 3 is a graph showing the dependency of the selectivity ratio of GaAs/$Al_{0.30}Ga_{0.70}As$ on RF power in the etching method of the present invention.

FIG. 3 is a graph showing the dependency of the selectivity ratio of GaAs/$Al_{0.30}Ga_{0.70}As$ on RF power in the etching method of the present invention. The graph in FIG. 3 is based on the etching rates of GaAs and $Al_{0.30}Ga_{0.70}As$ obtained when etching using a mixture of $Cl_2$, He, and $O_2$, and RF power is changed in a plasma of $Cl_2$, He, and $O_2$.

Figure 4:
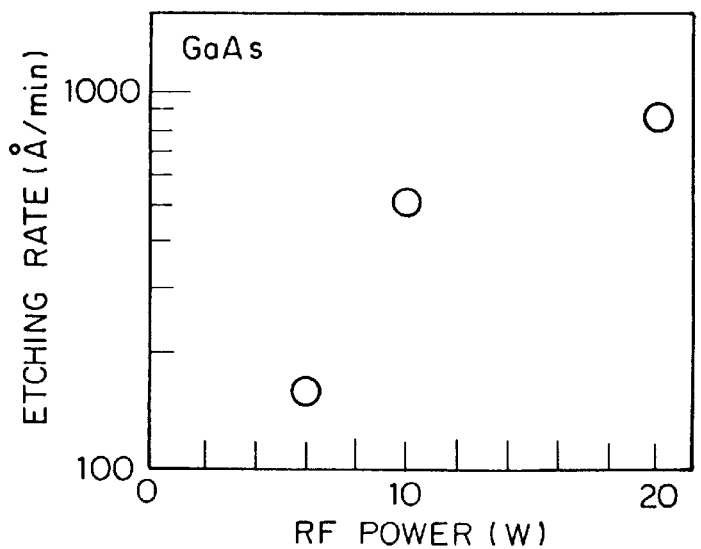
FIG. 4 is a graph showing the dependency of the etching rate of GaAs according to the present invention on RF power.
Figure 5:
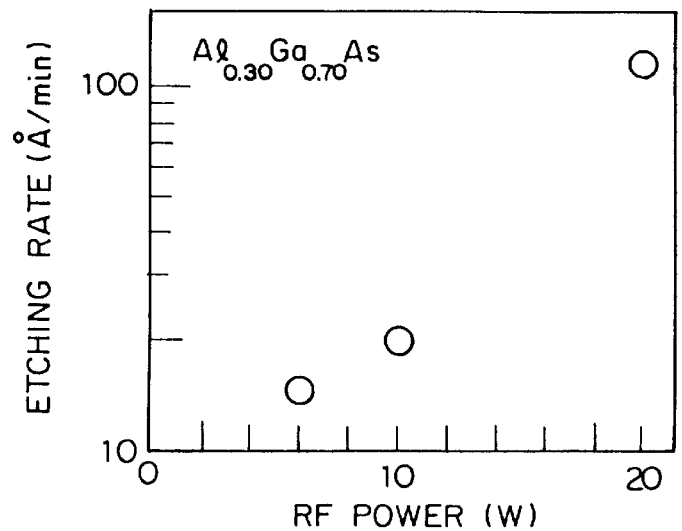
FIG. 5 is a graph showing the dependency of the etching rate of $Al_{0.30}Ga_{0.70}As$ according to the present invention on RF power.

FIGS. 4 and 5 are graphs showing the dependency of the etching rates of GaAs and $Al_{0.30}Ga_{0.70}As$, serving as sources in FIG. 3, on RF power. In an etching test of GaAs and $Al_{0.30}Ga_{0.70}As$ in FIGS. 4 and 5, the flow rates of $Cl_2$ and $N_2$ were set to 2 SCCM. Oxygen concentration was constant at 3%, and etching gas pressure was set to 0.5 mTorr.

GaAs and $Al_{0.30}Ga_{0.70}As$ were etched with a lower RF power with $N_2$ added to the mixture of $Cl_2$, He, and $O_2$. A reaction product was not deposited during etching when the RF power is within the range of 6 W to 20 W.

As shown in FIG. 3, a selectivity ratio of 25 could be obtained at an RF power of 10 W. Although the selectivity ratio was considerably smaller than in etching using a fluorine-based etching gas mixture, the etching rate of $Al_{0.30}Ga_{0.70}As$ could be almost equal to the rate in the fluorine-based etching gas.

Figure 6:
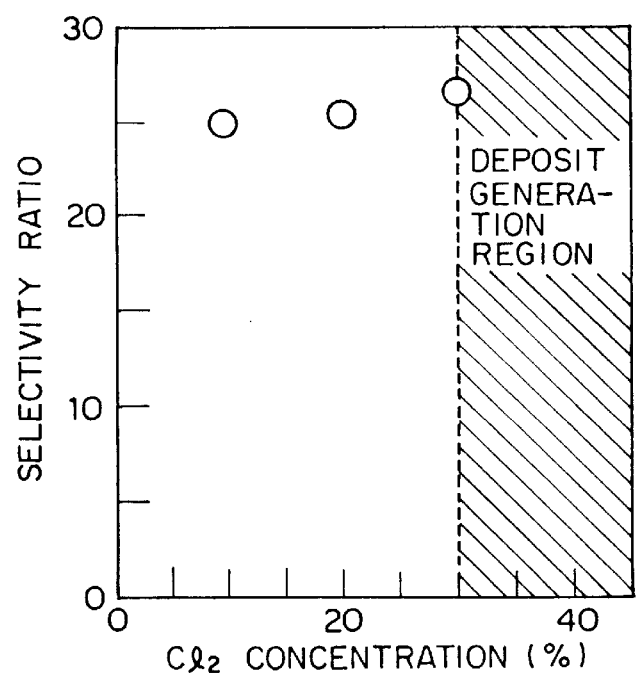
FIG. 6 is a graph showing the dependency of the selectivity ratio of GaAs/$Al_{0.30}Ga_{0.70}As$ according to the present invention on $Cl_2$ concentration.

FIG. 6 is a graph showing the dependency of the selectivity ratio of GaAs/$Al_{0.30}Ga_{0.70}As$, according to the present invention, on $Cl_2$ concentration. The etching conditions in FIG. 6 were set as follows: gas pressure was 0.5 mTorr; oxygen concentration was 3%; $N_2$ flow rate was 2 SCCM; RF power was 10 W; and the concentration of $Cl_2$ in the total flow rate was changed within the range of 10 to 30%. As shown in FIG. 6, when the chlorine concentration in the total flow rate changes, the selectivity ratio slightly changes. When the chlorine concentration was 30% or more, a reaction product was deposited on the etching surface.

Figure 7:
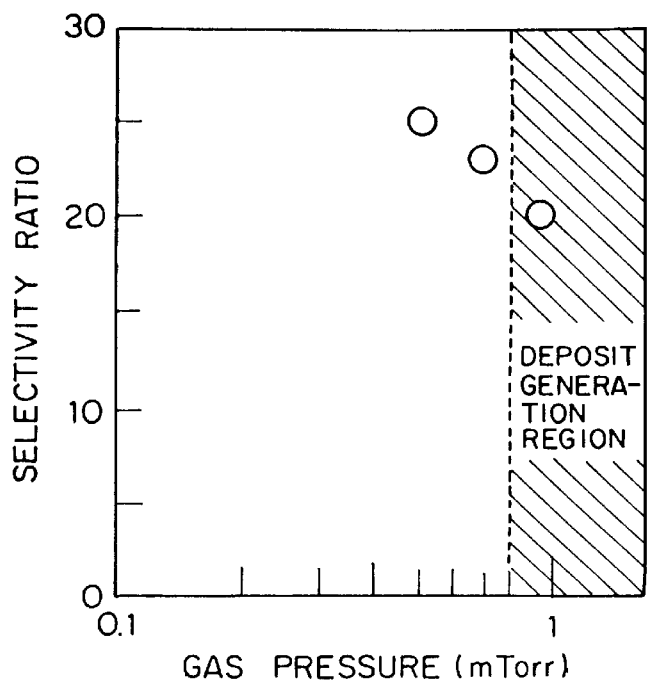
FIG. 7 is a graph showing the dependency of the selectivity ratio of GaAs/$Al_{0.30}Ga_{0.70}As$ according to the present invention on etching gas pressure.

FIG. 7 is a graph showing the dependency of the selectivity ratio of GaAs/$Al_{0.30}Ga_{0.70}As$ according to the present invention on etching gas pressure. The etching conditions in FIG. 7 were set as follows: the flow rates of $Cl_2$ and $N_2$ were 2 SCCM; oxygen concentration was constant at 3%; RF power was 10 W; and etchant gas pressure was changed. As shown in FIG. 7, the selectivity ratio gradually decreased with an increase in etchant gas pressure. When the etchant gas pressure was 0.8 mTorr or more, a reaction product was deposited. If a small amount of deposit on a surface to be processed is allowed in practice, the deposit at 1 mTorr or less does not matter.

According to the above results, in order to eliminate deposition of a reaction product during etching to increase the selectivity ratio of GaAs/$Al_{0.30}Ga_{0.70}As$, the concentration of Cl radicals must be increased in a plasma of $Cl_2$, He, $O_2$ and $N_2$.

Figure 8:
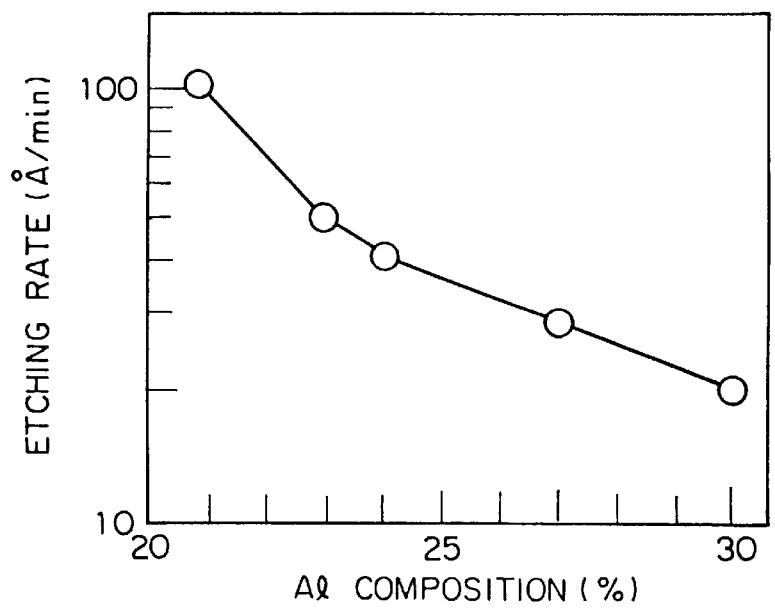
FIG. 8 is a graph showing the dependency of an etching rate of $Al_xGa_{1-x}As$ ($0<x\leq1$) according to the present invention on Al composition.

FIG. 8 is a graph showing the dependency of the etching rate of $Al_xGa_{1-x}As$ ($0<x\leq1$) according to the present invention on Al composition. The etching conditions in FIG. 8 were set as follows: the flow rates of $Cl_2$ and $N_2$ were 2 SCCM; oxygen concentration was constant at 3%; RF power was 10 W; and etchant gas pressure was 0.5 mTorr. Under these etching conditions, the etching rate of GaAs was 500 Å/min. As shown in FIG. 8, the etching rate of $Al_xGa_{1-x}As$ was dependent on Al composition x. The etching rate of $Al_xGa_{1-x}As$ decreases with an increase of the Al composition x.

Figure 9:
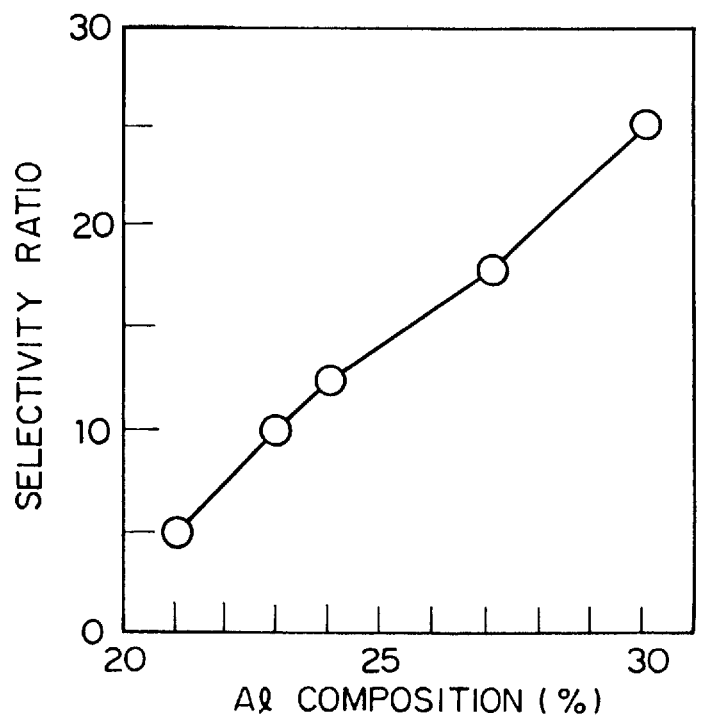
FIG. 9 is a graph showing the dependency of the selectivity ratio of GaAs/$Al_xGa1_{1-x}As$ ($0<x\leq1$) according to the present invention on Al composition.

FIG. 9 is a graph showing the dependency of the selectivity ratio of GaAs/Al$_x$Ga$_{1-x}$As (0<x≦1) according to the present invention, on Al composition. The result in FIG. 9 is converted on the basis of the data in FIG. 8. When the Al composition x changed from 0.30 to 0.24, the selectivity ratio became half. However, the etching rate of Al$_{0.24}$Ga$_{0.76}$As was about 40 Å/min.

Therefore, in selective etching using a plasma of Cl$_2$, He, O$_2$ and N$_2$, the selectivity ratio is several tens and an etching rate of Al$_x$Ga$_{1-x}$As similar to the etching rate using a fluorine-based etching gas is obtained.

On the basis of the above result, the etching conditions shown in Table 1 were set. The further detailed conditions were set as follows: the flow rates of Cl$_2$ and N$_2$ were 2 SCCM; oxygen concentration was constant at 3%; RF power was 10 W; and etchant gas pressure was 0.5 mTorr. Under these conditions, selective etching was achieved.

Figure 10:
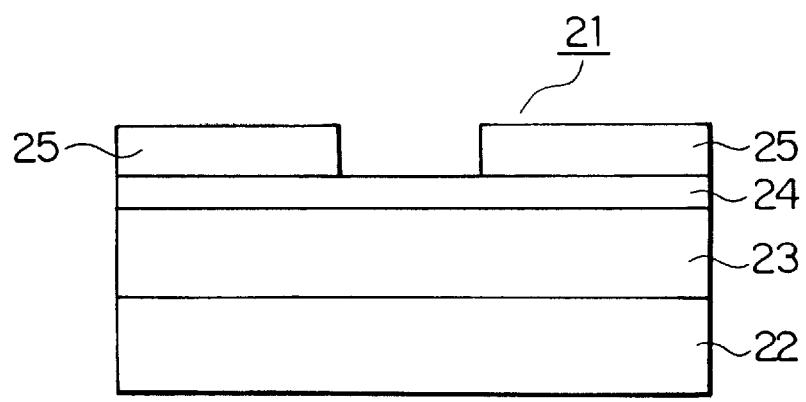
FIG. 10 shows an etching sample having a GaAs/AlGaAs heterojunction structure used in the selective etching method according to the present invention.

FIG. 10 shows a sample having a GaAs/AlGaAs heterojunction structure used in the selective etching method according to the present invention. Referring to FIG. 10, reference numeral 21 denotes an etching sample; and 22, a (100) plane semi-insulating GaAs substrate having a diameter of 3 inches. On the GaAs substrate 22, an undoped Al$_{0.24}$Ga$_{0.76}$As layer 23, which forms a heterojunction structure with the GaAs substrate 22, has a thickness of 500 Å, contains Al, and serves as a first III–V group compound semiconductor layer containing Al. An Si-doped GaAs layer 24, which has a thickness of 3,500 Å, serves as a second III–V group compound semiconductor layer from which Al is substantially absent. These layers are sequentially formed by MBE (molecular beam epitaxy). An SiO film 25 (thickness: 3,000 Å) serving as an etching mask is formed on the surface of the GaAs layer 24.

Figure 11:
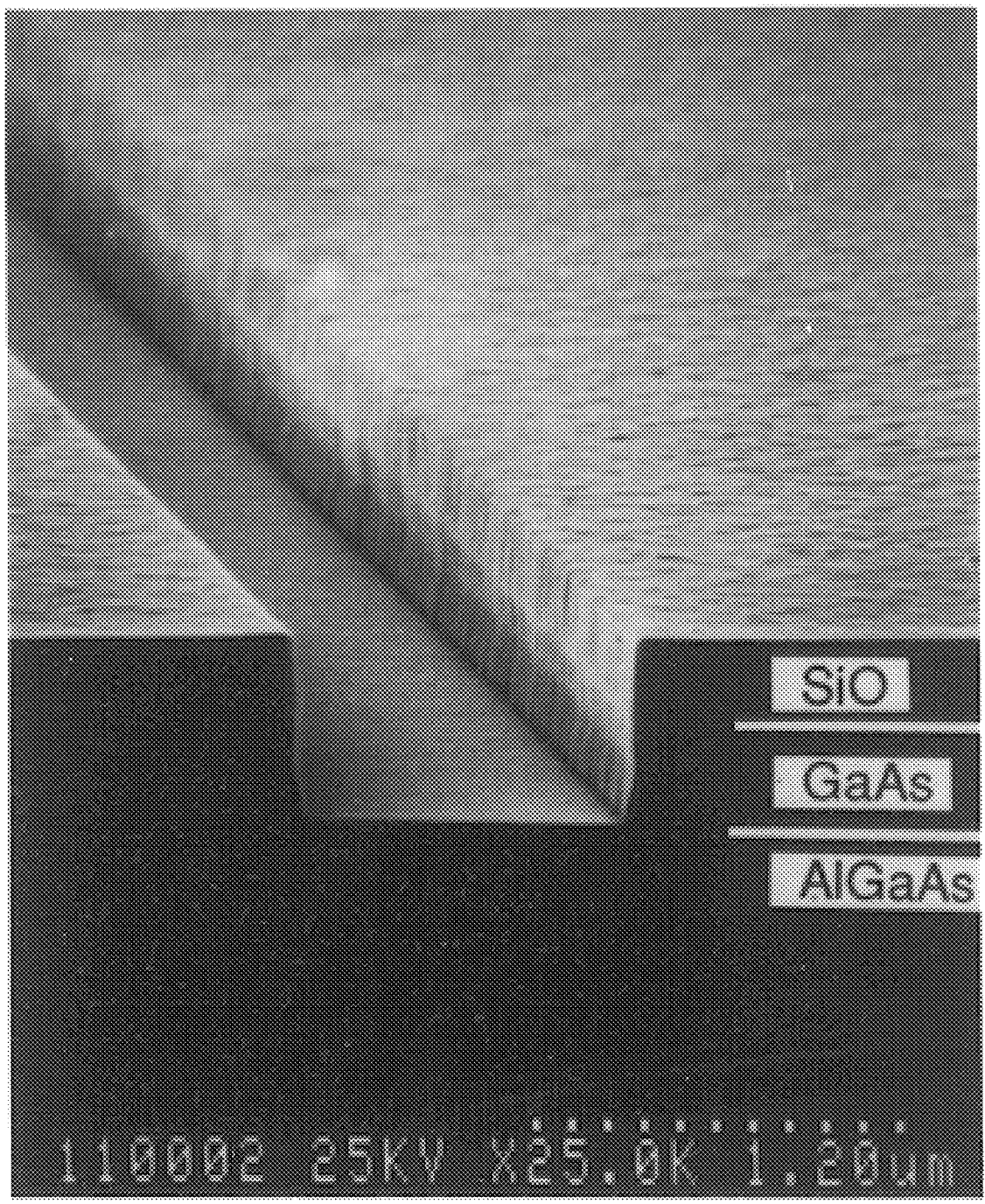
FIG. 11 is an electron microscope photograph showing a result obtained using the selective etching method according to the present invention.

FIG. 11 is an electron microscope photograph showing a result obtained using the selective etching method according to the present invention. As shown in FIG. 11, these etching conditions have the following sufficient selectivity: the selectivity of Al$_{0.24}$Ga$_{0.76}$As was 13, the etching rate of Al$_{0.24}$Ga$_{0.76}$As was 40 Å/min, excellent etching characteristics, i.e., a smooth etched surface, and a processing shape free from undercutting of the SiO film could be obtained.

In the selective etching method according to Embodiment 1, an ECR etching apparatus is used, the pressure of an etchant gas mixture of Cl$_2$, He, O$_2$ and N$_2$ is set to 1 mTorr or less, and a high-density plasma, e.g., a plasma density of $10^{10}$ cm$^{-3}$ or more, is set. When etching is performed under these conditions, Cl radicals, N radicals, and the like are generated in the plasma of the etching gas.

Chlorine radicals react with N radicals in the plasma of the etching gas mixture and gererate volatile NCl, thereby considerably decreasing Cl radicals. More specifically, Cl radicals in the plasma are considerably decreased due to the addition of N$_2$.

In order to prevent a reaction prodluct from being deposited on the etching surface during etching of GaAs, the balance between the generation and elimination of the reaction product on the etching surface must be kept stable. For this purpose, it is important to decrease the concentration of Cl radicals supplied to the Al$_{0.24}$Ga$_{0.76}$As layer or the GaAs layer on the GaAs substrate.

Therefore, according to the selective etching method of Embodiment 1, N$_2$ is mixed with a mixture of Cl$_2$, He, and O$_2$ as an etching gas, and N radicals are generated in a high-density plasma. A decrease in Cl radicals, which cannot be easily controlled only by decreasing the flow rate of Cl$_2$, can be achieved in the following manner. Cl radicals react with N radicals to form volatile NCl, thereby totally decreasing Cl radicals.

As a result, Cl radicals supplied to the AlGaAs layer and GaAs layer on the GaAs substrate decrease, and excessive generation of a reaction prcduct is suppressed. The balance between the generation and elimination of the reaction product on the etching surface is kept stable, the etching rate of the GaAs layer becomes stable, and the reaction product is prevented from being deposited on the etching surface.

Therefore, the following excellent effects can be obtained. The selective etching of GaAs/AlGaAs has excellent effects and excellent etching characteristics, i.e., a smooth etched surface and a processing shape which is faithful to a mask and which is free from undercutting of the SiO film 24 serving as the etching mask.

Embodiment 2

Embodiment 2 relates to a method of manufacturing a compound semiconductor device and, more particularly, to a method of manufacturing an HEMT. As an example of an HEMT, p-HEMTs (pseudomorphic high electron mobility transistors) each having an Al$_{0.24}$Ga$_{0.76}$As layer and a GaAs layer will be described below with reference to a method of manufacturing a p-HEMT, especially, in which the selective etching method of Embodiment 1 is used to form a gate recess structure.

Figure 12:
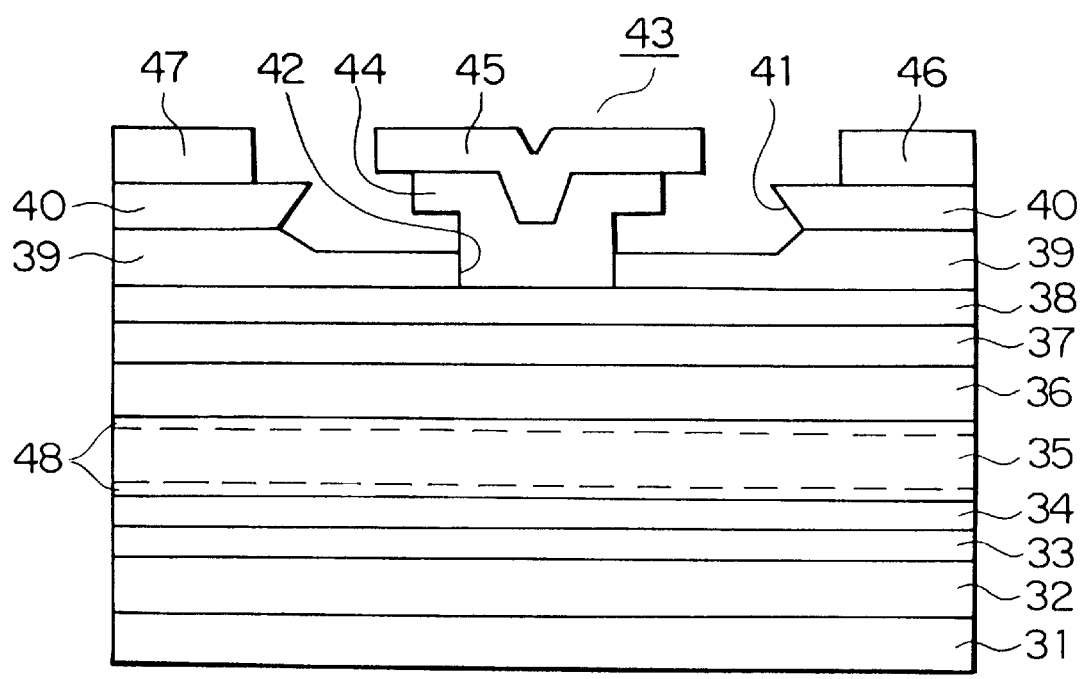
FIG. 12 is a sectional view showing the structure of p-HEMTs according to the present invention.

FIG. 12 is a sectional view showing the structure of p-HEMTs according to the present invention. Reference numeral 31 denotes a semi-insulating GaAs substrate, a III–V compound semiconductor substrate; 32, a buffer layer; 33, an n-type AlGaAs layer; 34, an undoped AlGaAs layer; 35, an active layer; 36, an undoped AlGaAs layer; 37, an electron donating layer; 38, an undoped AlGaAs layer; 39, an n$^-$-type GaAs layer; and 40, an n$^+$-type GaAs layer.

The buffer layer 32, the n-type AlGaAs layer 33, the undoped AlGaAs layer 34, the active layer 35, the undoped AlGaAs layer 36, the electron donating layer 37, the undoped AlGaAs layer 38, the n$^-$-type GaAs layer 39, and the n$^+$-type GaAs layer 40 are seqientially disposed on the semi-insulating GaAs substrate 31 by MBE.

A recess 41 is formed, by wet etching, in the n$^+$-type GaAs layer 40 and the n$^-$-type GaAs layer 39, not reaching the undoped AlGaAs layer 38, and a through hole 42 serving as an opening that reaches the undoped AlGaAs layer 38 is located in the central portion of the bottom surface of the recess 41. The recess 41 and the through hole 42 constitute a gate recess structure.

Reference numeral 43 denotes a T-shaped gate electrode. The T-shaped gate electrode 43 is constituted by a lower WSi layer 44 and an upper Au layer 45, and is in contact with the undoped AlGaAs layer 38 through the through hole 42.

Reference numeral 46 denotes a drain electrode, and 47, a source electrode. The drain electrode 46 and the source electrode 47 are formed on the n$^+$-type GaAs layer 40 such that the drain electrode 46 and the source electrode 47 are on opposite sides of the T-shaped gate electrode 43.

Reference numeral 48 denotes two-dimensional electron gas layers. The two-dimensional electron gas layers 48 are formed on the active layer 35 sides of the interface between the active layer 35 and the undoped AlGaAs layer 34 and the interface between the active layer 35 and the undoped AlGaAs layer 36. In this arrangement, gate length is 1.0 μm and gate width is 150 μm. The dopant is Si.

Table 2 is a specification of the respective layers of the p-HEMTs according to this embodiment.

TABLE 2

| Materials of layers | Impurity concentration (cm$^{-3}$) | Layer thickness (Å) |
|---|---|---|
| n$^+$-type GaAs layer 40 | 2 × 10$^{18}$ | 1000 |
| n$^-$-type GaAs Layer 39 | 5 × 10$^{16}$ | 1000 |
| Undoped AlGaAs layer 38 (x = 0.24) | | 300 |
| Electron donating layer 37: n-type Al$_x$Ga$_{1-x}$As layer (x = 0.24) | 3.5 × 10$^{18}$ | 100 |
| Undoped Al$_x$Ga$_{1-x}$As layer 36 (x = 0.24) | | 30 |
| Active layer 35: undoped In$_x$Ga$_{1-x}$As layer (x = 0.15) | | 200 |
| Undoped Al$_x$Ga$_{1-x}$As layer 34 (x = 0.24) | | 30 |
| n-type Al$_x$Ga$_{1-x}$As layer 33 (x = 0.24) | 3.5 × 10$^{18}$ | 50 |
| Buffer layer 32 | | |
| Semi-insulating GaAs substrate 31 | | |

The thickness of the n$^-$-type GaAs layer 39 on the bottom surface of the recess 41 is 500 Å.

In the p-HEMTs, the undoped AlGaAs layer 36 is arranged on the undoped InGaAs layer serving as the active layer 35, the n-type silicon-doped AlGaAs layer, which serves as the electron donating layer 37, with the undoped AlGaAs layer 36 intervening, thereby forming the two-dimensional electron gas layer 48 on the active layer 35 side of the heterojunction interface between the undoped AlGaAs layer 36 and the active layer 35. At this time, since the electron donating layer 37 is depleted, the T-shaped gate electrode 43 is formed on the electron donating layer 37 with the undoped AlGaAs layer 38 intervening, and the T-shaped gate electrode 43 is electrostatically connected to the two-dimensional electron gas layer 48 through the undoped AlGaAs layer 36, the electron donating layer 37, and the undoped AlGaAs layer 38. When a voltage is applied across the drain electrode 46 and the source electrode 47, and a voltage is applied to the T-shaped gate electrode 43, the same operation as that of a MOSFET can be performed at a high speed and a lower power consumption.

In the p-HEMT structure, the T-shaped gate electrode 43 is brought into contact with the undoped AlGaAs layer 38 through the through hole 42. For this reason, when the through hole 42 is formed in the n$^-$-type GaAs layer 39 on the bottom surface of the recess 41, the following is important. Etching is controlled so that the etching depth of the through hole 42 is accurate so that the influence of variations in the thicknesses of the AlGaAs layer 36, the electron donating layer 37, and the undoped AlGaAs layer 38 are as small as possible, thereby decreasing variations in FET operation characteristics.

FIGS. 13, 14, 15, and 16 are sectional views showing a wafer in steps in manufacturing a semiconductor device according to the present invention.

The buffer layer 32, the n-type AlGaAs layer 33, the undoped AlGaAs layer 34, the active layer 35, the undoped AlGaAs layer 36, the electron donating layer 37, the undoped AlGaAs layer 38, the n$^-$-type GaAs layer 39, and the n$^+$-type GaAs layer 40 are sequentially epitaxially grown on the semi-insulating GaAs substrate 31 using MBE to form a wafer 60. The specifications of the respective layers are shown in Table 2.

Figure 13:
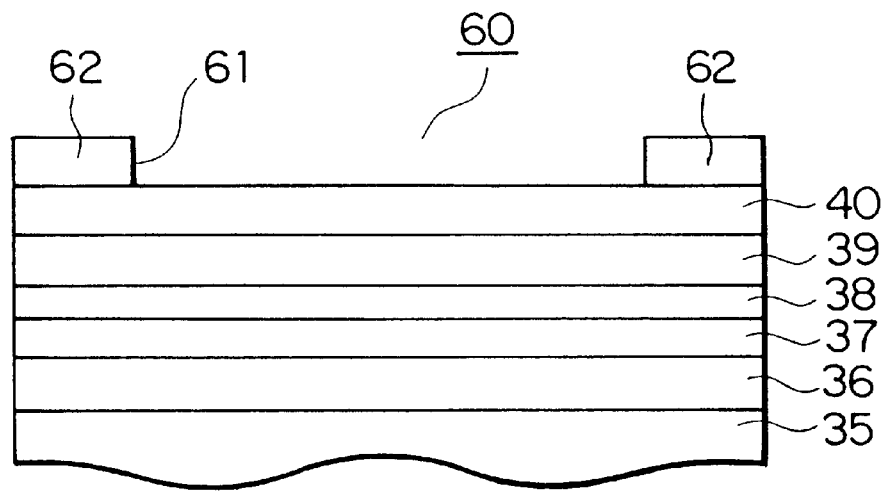
FIG. 13 is a sectional view showing a wafer in a step of a method of manufacturing a semiconductor device according to the present invention.

A resist is applied to the surface of the n$^+$-type GaAs layer 40 of the wafer 60, and a resist pattern 62 is formed using a mask pattern having an opening 61 for forming the recess 41. The wafer in this state is shown in FIG. 13.

Figure 14:
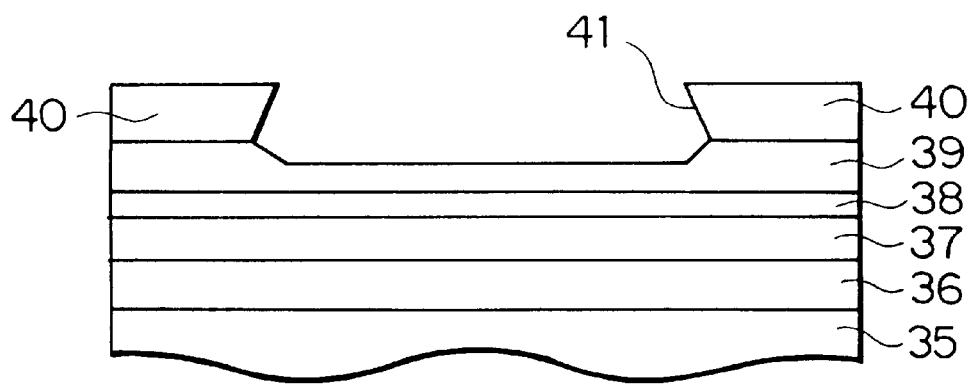
FIG. 14 is a sectional view showing a wafer in a step of a method of manufacturing a semiconductor device according to the present invention.

The wafer 60 is etched using tartaric acid and the resist pattern 62 as a mask to etch through the n$^+$-type GaAs layer 40, thereby forming the recess 41 having a bottom surface on which the n$^-$-type GaAs layer 39 is partially left. Thereafter, the resist is removed. The thickness of the n$^-$-type GaAs layer 39 left on the bottom surface of the recess 41 is about 500 Å. The wafer in this state is shown in FIG. 14.

Figure 15:
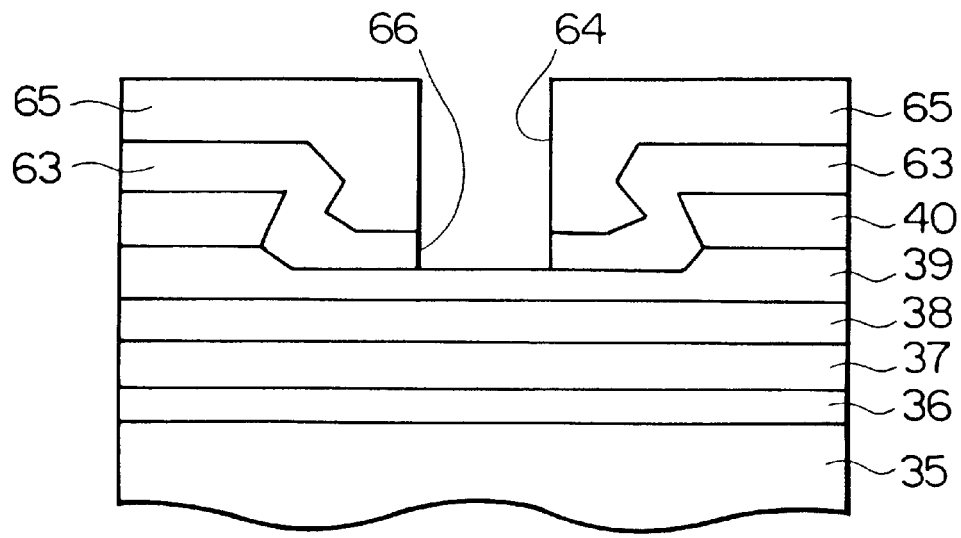
FIG. 15 is a sectional view showinc a wafer in a step of a method of manufacturing a semiconductor device according to the present invention.

Thereafter, an SiO film 63 is formed on the surface of the wafer 60, a resist is applied to the SiO film 63, and a resist pattern 65 having an opening 64 corresponding to the central portion of the bottom surface of the recess 41 is formed. An opening 66 reaching the n$^-$-type GaAs layer 39 is formed in the SiO film 63 by wet etching using the resist pattern 65 as a mask to form the SiO film 63. Thereafter, the resist is removed. The wafer in this state is shown in FIG. 15.

Figure 16:
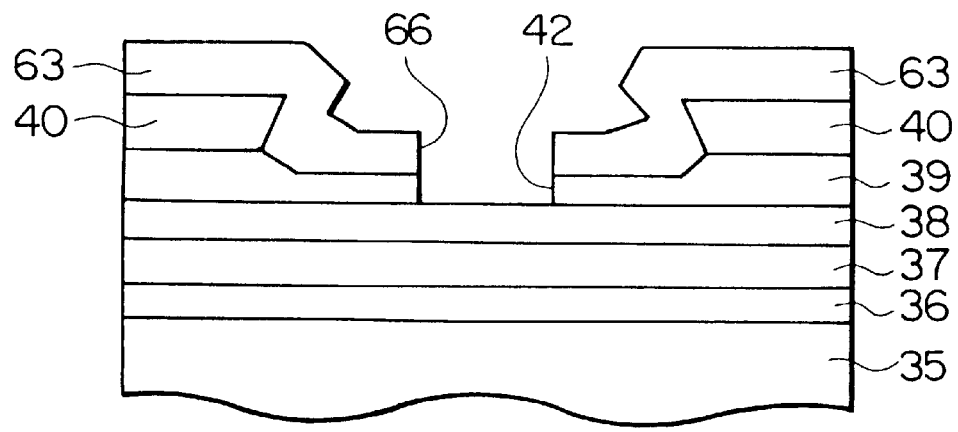
FIG. 16 is a sectional view showing a wafer in a step of a method of manufacturing a semiconductor device according to the present invention.

According to the selective etching method described as Embodiment 1, using the ECR etching apparatus, a mixture of Cl$_2$, He, O$_2$, and N$_2$ is used as an etching gas, thereby forming the through hole 42 in the n$^-$-type GaAs layer 39. More specifically, the wafer 60 including the SiO film 63 having the opening 66 is placed in the ECR etching apparatus shown in FIG. 1. Under the etching conditions of Table 1 and the selective etching method, the plasma density of the etching gas is set to be 10$^{10}$ cm$^{-3}$ or more, and etching is performed. In the etching conditions of Table 1, the flow rates of Cl$_2$ and N$_2$ are 2 SCCM, the oxygen concentration is constant at 3%, and the gas pressure is 0.5 mTorr. The wafer in this stage is shown in FIG. 16.

Thereafter, the SiO film 63 is removed, and the T-shaped gate electrode 43, the drain electrode 46, and the source electrode 47 are formed by a known method, thereby completing p-HEMTs having the structure shown in FIG. 12.

Figure 17:
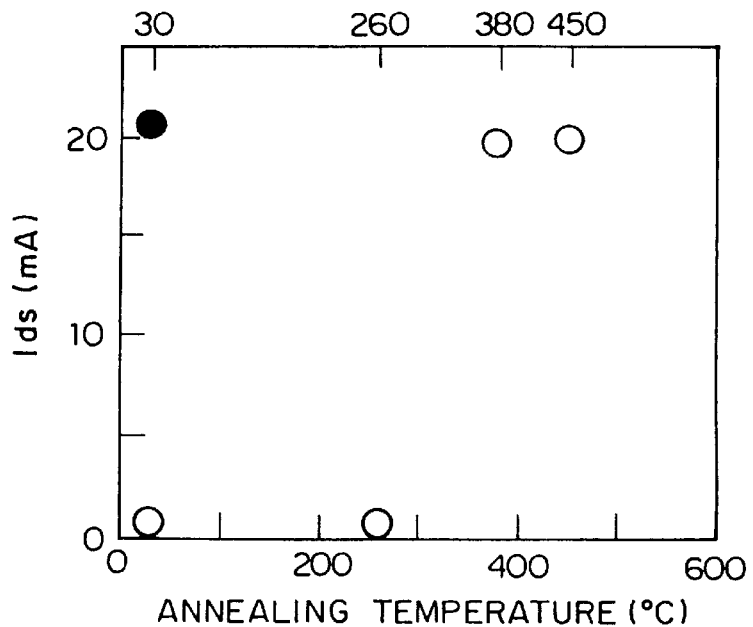
FIG. 17 is a graph showing source-drain currents (Ids) of p-HEMTs according to the present invention.

FIG. 17 is a graph showing source-drain currents (Ids) of p-HEMTs manufactured by a method according to the present invention. FIG. 17 shows the annealing temperature at which damage caused by the method of manufacturing the p-HEMT according to Embodiment 2 is removed and shows the Ids obtained upon annealing at a predetermined annealing temperature for 3 minutes. A blank circle (○) indicates the Ids of p-HEMTs manufactured according to Embodiment 2, and a solid circle (●) indicates the Ids of p-HEMTs manufactured by selective wet-etching for comparison with the Ids obtained in Embodiment 2.

As shown in FIG. 17, when the annealing temperature is 380° C. or more, the Ids in Embodiment 2 is equal to the Ids in wet-etching. According to this result, in Embodiment 2, damage caused by selective etching can be almost completely recovered by annealing at a temperature of 380° C. or more.

Figure 18:
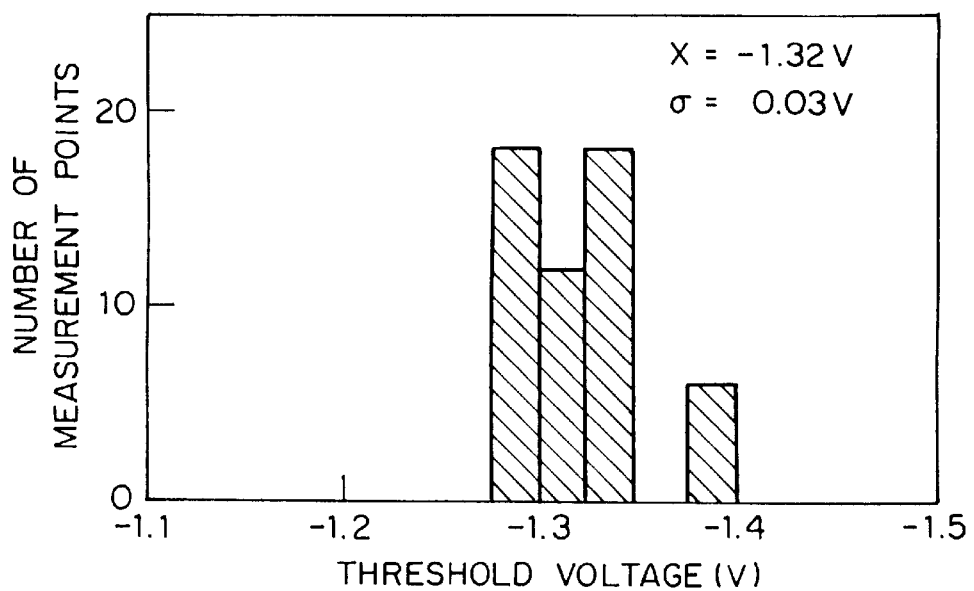
FIG. 18 is a histogram showing a variation in threshold voltage of p-HEMTs according to the present invention.

FIG. 18 is a histogram showing the variation in threshold voltage of p-HEMTs according to the present invention. FIG. 18 shows a result obtained by measuring threshold voltages Vth with respect to 54 points in the plane of the same 3-inch wafer to evaluate the uniformity of the depth of the through hole 42 of the gate recess structure using the selective etching method. According to this result, the average Vth is −1.32 V, and the standard deviation σ of Vth is 30 mV. Very uniform characteristics are obtained. The characteristics are equivalent to the characteristics of variations occurring when p-HEMTs are selectively etched using a fluorine-based gas.

As described above, when the selective etching of Embodiment 1 is used to form the gate recess structure in p-HEMTs, inactivation of silicon donors in AlGaAs caused by fluorine does not occur in the p-HEMTs, two-dimensional electron gas concentration can be increased, and Ids can be increased. In addition, when N radicals are formed in the high-density plasma of the etching gas, effectively decreasing Cl radicals, a reaction product is suppressed from being excessively generated, and the etching rate of the GaAs layer is stable. At the same time, the reaction product is prevented from being deposited on the etching surface, and an AlGaAs layer having a smooth surface and uniform dimensional accuracy of film thickness is obtained, thereby producing p-HEMTs having equal two-dimensional electron gas concentrations. Therefore, p-HEMTs having high drain-source current (Ids) and uniform threshold voltages Vth can be obtained using a simple manufacturing method.

Embodiment 3

Embodiment 3 is related to a method of manufacturing a semiconductor device and, more particularly, to a method of manufacturing an HFET.

Figure 19:
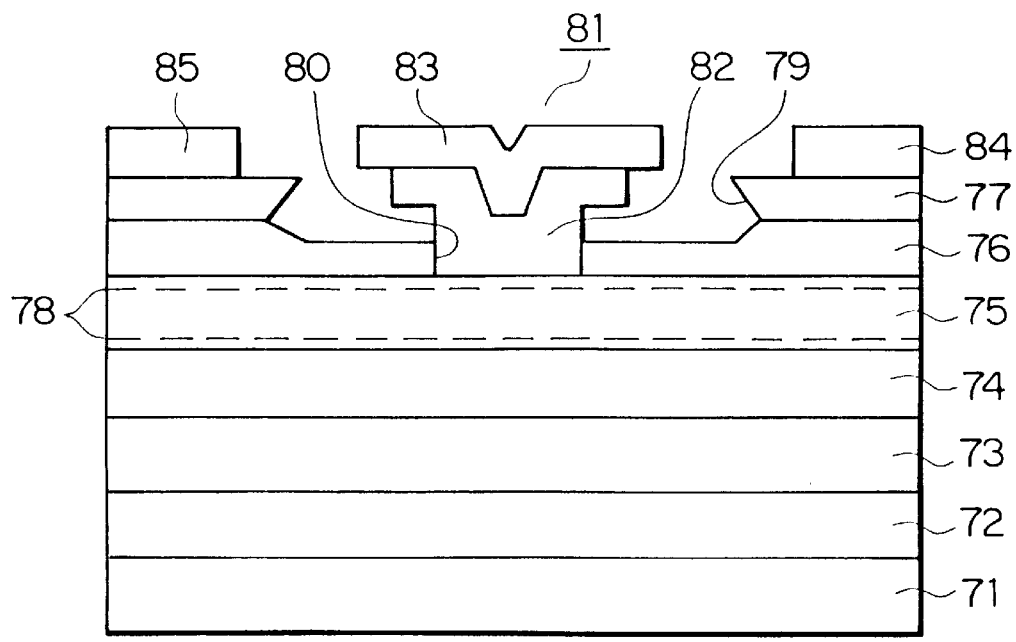
FIG. 19 is a sectional view showing the structure of an HEMT according to the present invention.

FIG. 19 is a sectional view showing the structure of an HFET according to the present invention. Reference numeral 71 denotes a semi-insulating GaAs substrate; 72, a buffer layer; 73, an undoped GaAs layer; and 74, an active layer constituted by an n-type GaAs layer. Reference numeral 75 denotes an n$^-$-type AlGaAs layer; 76, an n$^-$-type GaAs layer; and 77, an n$^+$-type GaAs layer.

Reference numeral 78 denotes a planar doped layer. On the n-type AlGaAs layer 75, at sides of the interface between the n$^-$-type AlGaAs layer 75 and the active layer 74 and between the n$^-$-type AlGaAs layer 75 and the n$^-$-type GaAs layer 76, the planar doped layers 78 are formed at positions spaced from the interfaces by 20. The planar doped layer 78 is used to moderate the band gap energy barrier of the interface between the AlGaAs layer and the GaAs layer.

The buffer layer 72, the undoped GaAs layer 73, the active layer 74, and the n$^-$-type AlGaAs layer 75, the n$^-$-type GaAs layer 76, and the n$^+$-type GaAs layer 77 are sequentially formed on the semi-insulating GaAs substrate 71 together with the planar doped layers 78 by MBE.

A recess 79 that does not reach the n$^-$-type AlGaAs layer 75 is formed in the n$^-$-type GaAs layer 76 and the n$^+$-type GaAs layer 77 by wet-etching, and a through hole 80 which reaches the n$^-$-type AlGaAs layer 75 is formed in the central portion of the bottom surface of the recess 79.

Reference numeral 81 denotes a T-shaped gate electrode. The T-shaped gate electrode 81 is constituted by a lower WSi layer 82 and an upper Au layer 83. The T-shaped gate electrode 81 is in contact with the undoped n$^-$-type AlGaAs layer 75 via the through hole 80.

Reference numeral 84 denotes a drain electrode, and 85, a source electrode. The drain electrode 84 and the source electrode 85 are arranged on the n$^+$-type GaAs layer 77 such that the drain electrode 84 and the source electrode 85 are on opposite sides of the T-shaped gate electrode 81.

In this arrangement, the gate length and gate width of the T-shaped gate electrode 81 are 0.5 μm and 150 μm, respectively. The n-type dopant is Si.

Table 3 is a list of specifications of the respective layers of the HEMT according to this embodiment.

TABLE 3

| Materials of layers | Impurity concentration (cm$^{-3}$) | Layer thickness (Å) |
|---|---|---|
| n$^+$-type GaAs layer 77 | $3 \times 10^{18}$ | 1000 |
| n$^-$-type GaAs layer 76 | $1 \times 10^{17}$ | 1500 |
| n$^-$-type AlGaAs layer 75 (x = 0.24) | $1 \times 10^{17}$ | 500 |
| Planar doped later 78 | $1 \times 10^{12}$ | |
| Active layer 74: n-type GaAs layer | $6 \times 10^{17}$ | 500 |
| Undoped GaAs layer 73 | | |
| Buffer layer 72 | | |
| Semi-insulating GaAs substrate 71 | | |

The thickness of the n$^-$-type GaAs layer 76 is 500 Å.

In this HFET, the n$^-$-type AlGaAs layer 75 is formed on the n-type GaAs layer serving as the active layer 74, and the n$^-$-type AlGaAs layer 75 is used as the Schottky surface of the gate. In this state, the maximum drain current is larger than that of an ordinary MOSFET, and a high power density is achieved. This device is a high power output FET.

The T-shaped gate electrode 81 forms a Schottky junction with the n$^-$-type AlGaAs layer 75 through the through hole 80. For this reason, when the through hole 80 is to be formed in the n$^-$-type GaAs layer 76 on the bottom surface of the recess 79, the following considerations are important. Etching must be controlled such that the etching depth of the through hole 42 is accurately determined, and variations in thickness of the n$^-$-type AlGaAs layer 75 are eliminated, thereby decreasing variations in FET operation characteristics.

The steps in manufacturing an HFET are almost the same as the steps in manufacturing a p-HEMT according to Embodiment 2 except for the step of forming a wafer. The steps in manufacturing a gate recess structure are the same as those in manufacturing a p-HEMT.

More specifically, the buffer layer 72, the undoped GaAs layer 73, the active layer 74, the n$^-$-type AlGaAs layer 75, the n$^-$-type GaAs layer 76, and the n$^+$-type GaAs layer 77 are sequentially grown on the semi-insulating GaAs substrate 71, together with the planar doped layers 78, by MBE to form a wafer. The wafer is etched using tartaric acid, and the recess 79, which extends through the n$^+$-type GaAs layer 77 and has a bottom surface on which the n$^-$-type GaAs layer 76 partially remains, is formed. An SiO film is deposited on the wafer surface, and a resist pattern having an opening corresponding to the central portion of the bottom surface of the recess 79 is formed. An opening that reaches the n$^-$-type GaAs layer 76 is formed in the SiO film by wet-etching using the resist pattern as a mask.

According to the selective etching method described as Embodiment 1, using the ECR etching apparatus, a mixture of Cl$_2$, He, O$_2$ and N$_2$ is used as an etching gas, thereby forming the through hole 76 in the n$^-$-type GaAs layer 76.

Thereafter, the Sio film is removed, and the T-shaped gate electrode 43, the drain electrode 46, and the source electrode 47 are formed by a known method, thereby completing manufacture of an HFET having the structure shown in FIG. 18.

Figure 20:
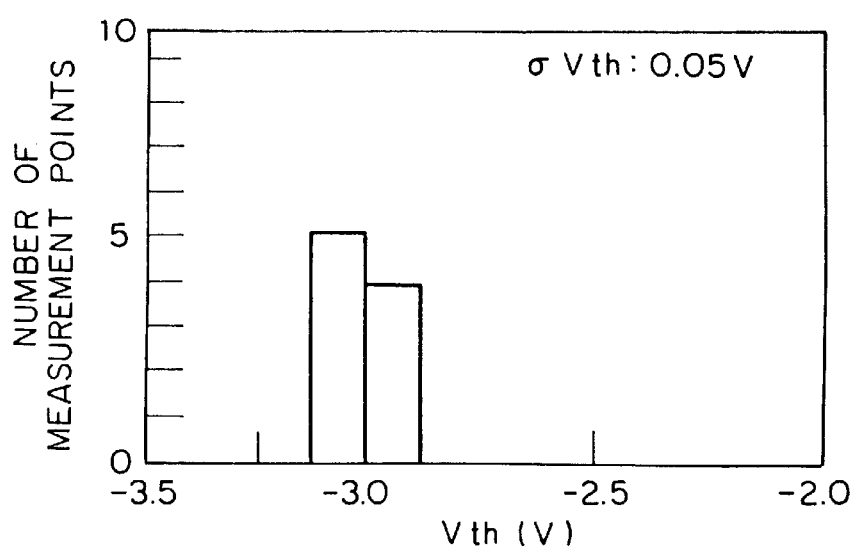
FIG. 20 is a histogram showing variations in threshold voltage of an HEMT according to the present invention.

FIG. 20 is a histogram showing variations in threshold voltage, Vth, of an HFET manufactured by a method of manufacturing a semiconductor device according to the present invention. FIG. 20 shows a result obtained by measuring threshold voltages Vth with respect to points in the plane of the same wafer to evaluate the uniformity of the depth of the through hole 80 of the gate recess structure obtained using the selective etching method. According to this result, the standard deviation σ of Vth is 50 mv.

As described above, when the selective etching of Embodiment 1 is used to form the gate recess structure in an HFET, inactivation of silicon donors in AlGaAs, caused by fluorine, does not occur in the HFET, and the maximum drain current can be advantageously increased. In addition, when N radicals are formed in the high-density plasma of the etching gas to effectively decrease Cl radicals, excessive generation of a reaction product is suppressed, and the etching rate of the GaAs layer is stable. At the same time, the reaction product is prevented from being deposited on the etching surface, and an AlGaAs layer having a smooth surface and uniform thickness dimensional accuracy is obtained, so that HFETs having uniform threshold voltages, Vth, can be obtained using a simple manufacturing method.

In this description, as the first III–V group compound semiconductor containing Al, an AlGaAs-based material is described. However, even if an AlGaAs-based material is used, the same effect as described above can be obtained.

Chlorine gas is described as a halogen gas, excluding fluorine. However, since, for example, bromine also reacts with nitrogen, like chlorine does, to form NBr, the same effect as described above can be obtained using bromine instead of chlorine.

Furthermore, in the described case an ECR etching apparatus is used as a plasma etching apparatus. However, an inductively coupled plasma (ICP) etching apparatus (ICP etching apparatus) may be used.

The method of selectively etching a compound semiconductor according to this invention and a method of manufacturing a compound semiconductor device using the method have the steps as described, so that these methods have the following effects.

In a method of selectively etching a compound semiconductor according to the present invention, a wafer having a first III–V group compound semiconductor layer containing Al and a second III–V group compound semiconductor layer on the first III–V group compound semiconductor layer and from which Al is substantially absent, is selectively etched using the first III–V group compound semiconductor layer containing Al as an etching stop layer. The wafer is etched using an etching gas mixture in a plasma having a plasma density of $10^{10}$ cm$^{-3}$ or more. The mixture contains oxygen, nitrogen, and a halogen gas, but not fluorine. For this reason, sufficient selectivity can be obtained, and a smooth etching surface and a processing shape which is faithful to an etching mask can be advantageously obtained.

Furthermore, when a wafer having $Al_xGa_{1-x}As$ ($0<x\leq1$) and GaAs thereon is selectively etched using $Al_xGa_{1-x}As$ ($0<x\leq1$) as an etching stop layer, sufficient selectivity can be obtained, and a smooth etched surface and a processing shape which is faithful to an etching mask can be advantageously obtained.

When a wafer having a first III–V group compound semiconductor layer containing Al and a second III–V group compound semiconductor layer on the first III–V group compound semiconductor layer and from which Al is substantially absent, or a wafer having $Al_xGa_{1-x}As$ ($0<x\leq1$) and GaAs thereon is selectively etched, when the concentration of nitrogen contained in the etching gas mixture is set to 5% or more, deposition of a reaction product on an etching surface can be effectively prevented.

When a wafer having a first III–V group compound semiconductor layer containing Al and a second III–V group compound semiconductor layer on the first III–V group compound semiconductor layer and from which Al is substantially absent, or a wafer having $Al_xGa_{1-x}As$ ($0<x\leq1$) and GaAs thereon is selectively etched, when the pressure of the etching gas is set to 1 mTorr or less, deposition of a reaction product on an etching surface can be effectively prevented.

According to the method of manufacturing a compound semiconductor device of the present invention, in a compound semiconductor device using a wafer having a first III–V group compound semiconductor layer containing Al and a second III–V group compound semiconductor layer on the first III–V group compound semiconductor layer and from which Al is substantially absent, when a gate recess structure is formed using the first III–V group compound semiconductor layer containing Al as an etching stop layer, etching is performed and a plasma is formed in an etching gas mixture with a plasma density of $10^{10}$ cm$^{-3}$ or more, the mixture containing oxygen, nitrogen, and a halogen gas, but not fluorine. For this reason, compound semiconductor devices having high drain-source currents (Ids) and uniform threshold voltages, Vth, can be produced in a simple manufacturing method.

The present invention may be applied to a manufacturing method in which a gate recess structure of a compound semiconductor device using a wafer having $Al_xGa_{1-x}As$ ($0<x\leq1$) and GaAs thereon is formed using $Al_xGa_{1-x}As$ ($0<x\leq1$) as an etching stop layer, so that compound semiconductor devices having high drain-source current (Ids) and uniform threshold voltages, Vth, can be produced in a simple manufacturing method.

The present invention may be applied to a method of manufacturing an HEMT in which a gate recess structure is formed using a wafer having $Al_xGa_{1-x}As$ ($0<x\leq1$) and GaAs thereon, and using $Al_xGa_{1-x}As$ ($0<x\leq1$) as an etching stop layer, so that compound semiconductor devices having high drain-source currents (Ids) and uniform threshold voltages, Vth, can be produced in a simple manufacturing method.

The present invention may be applied to a method of manufacturing an HFET in which a gate recess structure is formed using a wafer having $Al_xGa_{1-x}As$ ($0<x\leq1$) and GaAs thereon, and using $Al_xGa_{1-x}As$ ($0<x\leq1$) as an etching stop layer, compound semiconductor devices having uniform threshold voltages, Vth, can be produced in a simple manufacturing method.

When the concentration of nitrogen contained in the etching gas mixture used in formation of the gate recess structure is 5% or more, deposition of a reaction product on an etching surface is effectively prevented, and compound semiconductor devices, HEMTs, or HFETs having high drain-source currents (Ids) and uniform threshold voltages, Vth, can be produced in a simple manufacturing method.

When the pressure of the etching gas mixture is 1 mTorr in the formation of the gate recess structure, deposition of a reaction product on an etching surface is effectively prevented, and compound semiconductor devices, HEMTs, or HFETs having high drain-source currents (Ids) and uniform threshold voltages, Vth, can be produced in a simple manufacturing method.

I claim:

1. A method of selectively etching a compound semiconductor comprising:

forming on a semiconductor wafer a structure having a first III–V compound semiconductor layer containing Al and a second III–V compound semiconductor layer free of Al disposed on said first III–V compound semiconductor layer;

forming an etching mask on said second III–V compound semiconductor layer;

supporting said semiconductor wafer, said structure, and said etching mask on a support base in a reaction chamber including plasma generation means for generating a plasma in an etching gas; and feeding an etching gas containing oxygen, nitrogen, and a halogen gas, excluding fluorine, to the reaction chamber and generating a plasma in the etching gas thereby selectively etching said second III–V compound semiconductor layer, using said first III–V compound semiconductor layer as an etching stop layer without forming an etching residue on said first layer.

2. The method of selectively etching a compound semiconductor according to claim 1, wherein said first III–V compound semiconductor layer consists of $Al_xGa_{1-x}As$ ($0<x\leq1$), and said second III–V semiconductor layer consists of GaAs.

3. The method of selectively etching a compound semiconductor according to claim 1, wherein the concentration of nitrogen in the etching gas is not less than 5%.

4. The method of selectively etching a compound semiconductor according to claim 1, wherein the gas pressure of the etching gas is not more than 1 mTorr.

5. A method of manufacturing a compound semiconductor device comprising:

forming on a III–V compound semiconductor substrate a structure having a first III–V compound semiconductor layer containing Al, a second III–V compound semiconductor layer free of Al disposed on said first III–V compound semiconductor layer;

forming a mask pattern on said second III–V compound semiconductor layer;

etching said second III–V compound semiconductor layer, using the mask pattern, to form a recess while leaving part of said second III–V compound semiconductor layer in the recess;

forming an etching mask on said second III–V compound semiconductor layer except on a part of said second III–V compound semiconductor layer in the recess;

supporting said semiconductor substrate, said structure, and said etching mask on a support base in a reaction chamber including plasma generation means for generating a plasma in an etching gas;

feeding an etching gas containing oxygen, nitrogen, and a halogen gas, excluding fluorine, into the reaction chamber and generating a plasma in the etching gas thereby selectively etching said structure, using said first III–V compound semiconductor layer as an etching stop layer, and forming an opening, reaching said first III–V compound semiconductor layer, in said second III–V compound semiconductor layer without forming an etching residue on said first layer; and depositing an electrically conductive layer, through the opening, on said first III–V compound semiconductor layer in the recess to form a gate electrode.

6. The method of manufacturing a compound semiconductor device according to claim 5, wherein said first III–V compound semiconductor layer consists of $Al_xGa_{1-x}As$ ($0<x\leq1$), said second III–V semiconductor layer consists of GaAs, and said III–V compound semiconductor substrate is GaAs.

7. The method of manufacturing a compound semiconductor device according to claim 5, wherein said semiconductor substrate is GaAs and including forming an n-type $Al_xGa_{1-x}As$ layer serving as an electron donating layer as said first III–V compound semiconductor layer on an undoped InGaAs layer serving as an active layer and disposed on said GaAs substrate.

8. The method of manufacturing a compound semiconductor device according to claim 5, wherein said substrate is GaAs and including forming a conductive GaAs layer on said GaAs substrate as an active layer and forming a conductive $Al_xGa_{1-x}As$ layer on said GaAs layer as said first III–V compound semiconductor layer.

9. The method of manufacturing a compound semiconductor device according to claim 5, wherein the concentration of nitrogen in the etching gas is not less than 5%.

10. The method of selectively etching a compound semiconductor according to claim 5, wherein the gas pressure of the etching gas is not more than 1 mTorr.

11. The method of selectively etching a compound semiconductor according to claim 2, wherein the concentration of nitrogen in the etching gas is not less than 5%.

12. The method of selectively etching a compound semiconductor according to claim 2, wherein the gas pressure of the etching gas is not more than 1 mTorr.

13. The method of manufacturing a compound semiconductor device according to claim 6, wherein the concentration of nitrogen in the etching gas is not less than 5%.

14. The method of manufacturing a compound semiconductor device according to claim 7, wherein the concentration of nitrogen in the etching gas is not less than 5%.

15. The method of manufacturing a compound semiconductor device according to claim 8, wherein the concentration of nitrogen in the etching gas is not less than 5%.

16. The method of selectively etching a compound semiconductor according to claim 6, wherein the gas pressure of the etching gas is not more than 1 mTorr.

17. The method of selectively etching a compound semiconductor according to claim 7, wherein the gas pressure of the etching gas is not more than 1 mTorr.

18. The method of selectively etching a compound semiconductor according to claim 8, wherein the gas pressure of the etching gas is not more than 1 mTorr.

* * * * *